United States Patent
An

(10) Patent No.: US 9,059,426 B2
(45) Date of Patent: Jun. 16, 2015

(54) ORGANIC LIGHT EMITTING DEVICE AND METHOD OF MANUFACTURING THE SAME

(75) Inventor: Chi-Wook An, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 342 days.

(21) Appl. No.: 13/080,139

(22) Filed: Apr. 5, 2011

(65) Prior Publication Data

US 2011/0241029 A1   Oct. 6, 2011

(30) Foreign Application Priority Data

Apr. 6, 2010 (KR) .................. 10-2010-0031555

(51) Int. Cl.
    H01L 27/32  (2006.01)
    H01L 51/50  (2006.01)
    H01L 51/52  (2006.01)
    H01L 33/00  (2010.01)

(52) U.S. Cl.
    CPC ............ *H01L 51/5228* (2013.01); *H01L 33/00* (2013.01)

(58) Field of Classification Search
    CPC .......... H01L 33/00; H01L 51/50; H02L 27/32
    USPC ......................................................... 257/88
    See application file for complete search history.

(56) References Cited

U.S. PATENT DOCUMENTS

| | | | |
|---|---|---|---|
| 5,589,738 A * | 12/1996 | Onodaka et al. ........... 315/169.1 |
| 6,201,346 B1 | 3/2001 | Kusaka | |
| 6,486,601 B1 | 11/2002 | Sakai et al. | |
| 7,042,154 B2 * | 5/2006 | Kobayashi .................... 313/506 |
| 7,411,344 B2 | 8/2008 | Yamazaki et al. | |
| 2002/0011783 A1 | 1/2002 | Hosokawa | |
| 2002/0158835 A1 | 10/2002 | Kobayashi et al. | |
| 2005/0099369 A1 | 5/2005 | Lee | |
| 2005/0173693 A1 * | 8/2005 | Uchida .......................... 257/13 |
| 2005/0258436 A1 | 11/2005 | Arai | |
| 2006/0231844 A1 | 10/2006 | Carter | |

(Continued)

FOREIGN PATENT DOCUMENTS

| | | |
|---|---|---|
| JP | 2001230086 | 8/2001 |
| JP | 2002318556 | 10/2002 |

(Continued)

OTHER PUBLICATIONS

Japanese Office Action issued by JPO on Aug. 5, 2014 in corresponding Japanese Patent Application No. 2010-286174 and Request for Entry of the Accompanying Office Action attached herewith.

(Continued)

*Primary Examiner* — Julio Maldonado
*Assistant Examiner* — Mohammad Choudhry
(74) *Attorney, Agent, or Firm* — Robert E. Bushnell, Esq.

(57) ABSTRACT

An organic light emitting display device can prevent a voltage dropping in a cathode electrode. The organic light emitting display device includes a substrate, cathode wiring arranged on a surface of the substrate, an anode electrode arranged on the substrate and electrically insulated from the cathode wiring, an organic layer arrangement arranged on the anode electrode to form a plurality of unit pixels, a cathode electrode covering the organic layer arrangement and at least one electrical connection unit to electrically connect the cathode wiring to the cathode electrode.

17 Claims, 8 Drawing Sheets

(56) References Cited

U.S. PATENT DOCUMENTS

| | | |
|---|---|---|
| 2006/0281204 A1 | 12/2006 | Chang et al. |
| 2007/0080356 A1 | 4/2007 | Nakayama et al. |
| 2008/0018239 A1 | 1/2008 | Matsuda et al. |
| 2009/0015151 A1 | 1/2009 | Ishihara et al. |
| 2009/0110956 A1* | 4/2009 | Begley et al. .................. 428/690 |
| 2011/0198657 A1 | 8/2011 | Lang et al. |

FOREIGN PATENT DOCUMENTS

| | | |
|---|---|---|
| JP | 2005332773 A | 12/2005 |
| JP | 200752966 A | 3/2007 |
| JP | 2007103098 A | 4/2007 |
| JP | 200827722 A | 2/2008 |
| JP | 200916298 A | 1/2009 |
| KR | 100544138 | 1/2006 |
| KR | 1020060129786 | 12/2006 |
| KR | 1020090016238 A | 2/2009 |
| WO | 0001203 A1 | 1/2000 |
| WO | 2009106040 A1 | 9/2009 |

OTHER PUBLICATIONS

Japanese Office Action issued by JPO on Apr. 7, 2015 in corresponding Japanese Patent Application No. 2010-286174 and Request for Entry of the Accompanying Office Action attached herewith.

* cited by examiner

ORGANIC LIGHT EMITTING DEVICE AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on the 6 Apr. 2010 and there duly assigned Serial No. 10-2010-0031555.

BACKGROUND OF THE INVENTION

1. Field of the Invention

The present invention relates to an organic light emitting display device that can prevent voltage drop in a cathode electrode and a method of manufacturing the organic light emitting display device.

2. Description of the Related Art

Among display apparatuses, organic light emitting display devices generally have wide viewing angles, high contrast ratios, and short response times, and thus are considered as next generation display apparatuses. Organic light emitting display devices have an emission layer made out of an organic material and arranged between an anode electrode and a cathode electrode. The organic light emitting display devices may be classified as bottom emission type and top emission type according to the direction light is transmitted. Top emission type organic light emitting display devices may have a higher aperture ratio compared to bottom emission type organic light emitting display devices. However, in the top emission type organic light emitting display devices, the light transmits through the cathode electrode, and thus the cathode electrode must be transparent in addition to being conductive. Consequently, there may be a voltage drop (i.e., an IR drop) in the cathode electrode. In particular, as size of the organic light emitting display device increases, the voltage drop may become severe.

SUMMARY OF THE INVENTION

The present invention provides a design for an organic light emitting display device that can prevent a voltage drop in a cathode electrode.

The present invention also provides a method of manufacturing the organic light emitting display device that can prevent a voltage drop in a cathode electrode.

According to an aspect of the present invention, there is provided an organic light emitting display device including a substrate, cathode wiring arranged on a surface of the substrate, an anode electrode arranged on the substrate and electrically insulated from the cathode wiring, an organic layer arrangement arranged on the anode electrode to form a plurality of unit pixels, a cathode electrode covering the organic layer arrangement and at least one electrical connection unit to electrically connect the cathode wiring to the cathode electrode.

The electrical connection unit may penetrate through the organic layer arrangement. The organic layer arrangement may include an organic emission layer, the electrical connection unit being electrically insulated from the organic emission layer. The electrical connection unit may be electrically connected to a portion of the cathode electrode where a voltage drop occurs. The electrical connection unit may be electrically connected to a center portion of the cathode electrode. The electrical connection unit may be arranged between adjacent ones of the plurality of unit pixels. The organic light emitting display device may include a plurality of electrical connection units, there may be a one-to-one correspondence between the electrical connection units and the unit pixels. Each electrical connection unit may extend along a side surface of a corresponding one of the plurality of unit pixels. Each electrical connection unit may surround an outer surface of a corresponding one of the plurality of unit pixels. The electrical connection unit may include a same material as that of the cathode electrode. The electrical connection unit may include a material that is different from that of the cathode electrode. The cathode electrode may be a transflective electrode. The organic layer arrangement may include a hole injection layer, a hole transport layer, the organic emission layer, an electron transport layer, and an electron injection layer sequentially stacked. The organic light emitting display device may further include driving wiring, the cathode wiring and the driving wiring may be arranged on a same plane.

According to another aspect of the present invention, there is provided a method of manufacturing an organic light emitting display device, including preparing a substrate comprising cathode wiring on a surface of the substrate, forming an anode electrode that is electrically insulated from the cathode wiring on the substrate, forming an organic layer arrangement on the anode electrode, forming an opening that penetrates through the organic layer arrangement and exposes the cathode wiring, forming an electrical connection unit that is electrically connected to the cathode wiring by filling the opening with a conductive material and forming a cathode electrode that covers the organic layer arrangement and is electrically connected to the electrical connection unit.

The forming of the opening may include preparing a mask having a protrusion, a size of which corresponds to a size of the opening and pressing the protrusion onto the organic layer arrangement. The forming of the opening may include removing the organic layer arrangement that corresponds to the opening by irradiating laser radiation onto the organic layer arrangement. The forming of the electrical connection unit and the forming of the cathode electrode may be performed simultaneously.

According to another aspect of the present invention, there is provided a method of manufacturing an organic light emitting display device, the method including preparing a substrate comprising cathode wiring on a surface of the substrate, forming an anode electrode that is electrically insulated from the cathode wiring on the substrate, forming an organic layer arrangement on the anode electrode, forming a cathode electrode covering the organic layer arrangement, forming an opening that penetrates through the cathode electrode and the organic layer arrangement and exposes the cathode wiring and forming an electrical connection unit that is electrically connected to the cathode wiring by filling the opening with a conductive material. The forming of the opening may include forming a mask pattern on the cathode electrode and etching the cathode electrode and the organic layer arrangement by using the mask pattern.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
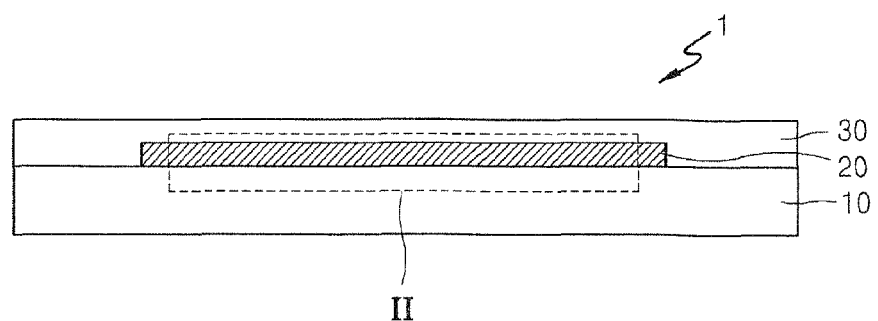
FIG. 1 is a cross-sectional view of an organic light emitting display device according to an embodiment of the present invention.

The embodiments of the present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

Figure 2:
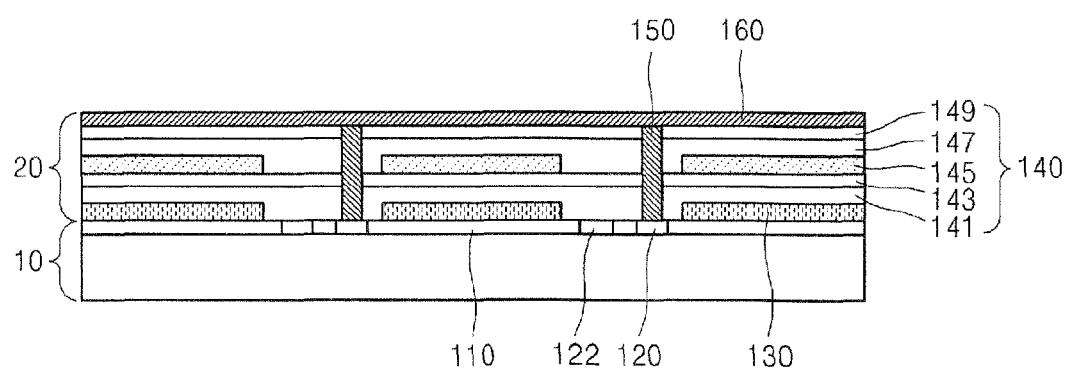
FIG. 2 is an expanded cross-sectional view showing a region II of FIG. 1.

Turning now to FIGS. 1 and 2, FIG. 1 is a cross-sectional view of an organic light emitting display device 1 according to an embodiment of the present invention, and FIG. 2 is an expanded cross-sectional view of part II of FIG. 1. Referring to FIG. 1, the organic light emitting display device 1 includes a substrate 10, a display unit 20 formed on the substrate 10, and a sealing unit 30 for sealing the display unit 20. Although it is not shown in FIG. 1, the organic light emitting display device 1 may further include a color filter layer and a black matrix layer.

Referring to FIG. 2, part II in the organic light emitting display device 1 of FIG. 1 corresponding to the substrate 10 and the display unit 20 are expanded. The substrate 10 includes cathode wiring 120 on a surface thereof. The display unit 20 includes an anode electrode 130, an organic layer arrangement 140, and a cathode electrode 160. In addition, the display unit 20 includes an electrical connection unit 150 that electrically connects the cathode wiring 120 to the cathode electrode 160.

The substrate 10 may be made out of a transparent or an opaque material. For example, if the organic light emitting display device is a bottom emission type or a dual emission type organic light emitting display device, in which images are displayed towards the substrate 10, the substrate 10 is made out of a transparent material. However, if the organic light emitting display device is a top emission type in which images are displayed opposite the substrate 10, the substrate 10 may be made out of an opaque material. The substrate 10 may be made out of a transparent glass material including silicon oxide ($SiO_2$) or a transparent plastic material. For example, the substrate 10 may include a plastic material such as an organic material selected from the group consisting of polyethersulphone (PES), polyacrylate (PAR), polyetherimide (PEI), polyethyelenen napthalate (PEN), polyethyelene-terepthalate (PET), polyphenylene sulfide (PPS), polyallylate, polyimide, polycarbonate (PC), cellulose tri-acetate (TAC), and cellulose acetate to propionate (CAP). In addition, the substrate 10 may be made out of a metal material. For example, the substrate 10 may include one or more selected from the group consisting of carbon (C), iron (Fe), chrome (Cr), manganese (Mn), nickel (Ni), titanium (Ti), molybdenum (Mo), stainless steel, Invar alloy, Inconel alloy, and Kovar alloy. Otherwise, the substrate 10 may be made out of metal foil. It is to be understood that the embodiments of the present invention are not limited to the above materials for forming the substrate 10.

Although it is not shown in the drawings, the substrate 10 may include a plurality of thin film transistors (not shown) and a plurality of capacitors (not shown). The thin film transistors may include a gate electrode, a source electrode, a drain electrode, a semiconductor active layer, and a gate insulating layer. The thin film transistors and the capacitors are electrically connected to the display unit 20 to control light emission from the display unit 20. In general, the anode electrode 130 formed in the display unit 20 is electrically connected to the drain electrode (not shown) of the thin film transistors.

The substrate 10 may include the cathode wiring 120 on the surface thereof, and may optionally include driving wiring 122. The cathode wiring 120 is electrically insulated from the anode electrode 130 and is electrically connected to the cathode electrode 160 to apply a voltage to the cathode electrode 160. The driving wiring 122 may be a general driving voltage source Vdd that is electrically connected to the thin film transistors. The cathode wiring 120 and the driving wiring 122 may be fabricated during the same fabrication processes and on the same plane, and may be made out of the same material. In addition, the cathode wiring 120 may be formed in a region on which unit pixels are not formed, however, embodiments of the present invention are not limited thereto. The cathode wiring 120 may be transparent, transflective or opaque.

In addition, the substrate 10 may optionally and further include a protective layer 110 thereon. The protective layer 110 may protect the thin film transistors, planarize the substrate 10, and prevent impurities from infiltrating into the substrate 10. The protective layer 110 may be produced by using various techniques such as chemical vapor deposition (CVD), plasma enhanced CVD (PECVD), atmospheric pressure CVD (APCVD), or low pressure CVD (LPCVD). The protective layer 110 may be made out of inorganic and/or organic material. The inorganic material may include $SiO_2$, SiNx, SiON, $Al_2$, $O_3$, $TiO_2$, $Ta_2$, $O_5$, $HfO_2$, $ZrO_2$, BST, or PZT. The organic material may include general universal polymers (PMMA or PS), polymer derivatives including phenol group, acryl-based polymers, imide-based polymers, arylether-based polymers, amide-based polymer, p-xylene based polymers, vinyl alcohol based polymers, and combinations thereof. In addition, the protective layer 110 may include a plurality of multiple layers stacked on each other including an inorganic insulating layer that includes an inorganic material and an organic insulating layer that includes an organic material. The protective layer 110 may be a buffer layer or a passivation layer.

The display unit 20 emits light to display predetermined image information, and includes the anode electrode 130, the organic layer arrangement 140, and the cathode electrode 160. The anode electrode 130 is located on the substrate 10 or on the protective layer 110, and is electrically connected to the thin film transistors (not shown) formed on the substrate 10. The anode electrode 130 may be a transparent electrode or a reflective electrode. If the anode electrode 130 is a transparent electrode, the anode electrode 130 includes indium tin oxide (ITO), indium zinc oxide (IZO), ZnO, or $In_2O_3$. If the anode electrode 130 is a reflective electrode, the anode electrode 130 may include a reflective layer made out of Ag, Mg, Al, Pt, Pd, Au, Ni, Nd, Ir, Cr, or a compound thereof, and a transparent electrode layer made out of ITO, IZO, ZnO, or $In_2O_3$ and located on the reflective layer, however, embodiments of the present invention are not limited to the above examples. In addition, the anode electrode 130 may be a single layer or a multi-layer structure. The anode electrode 130 may be deposited by a general deposition technique such as CVD or a sputtering technique, and patterned using a photolithography technique. The anode electrode 130 may have a size corresponding to that of the unit pixel that is fabricated later.

Although it is not shown in the drawings, a pixel defining layer (PDL) that covers edges of the anode electrode 130 and has a predetermined thickness outside of the anode electrode 130 may be further formed. The PDL may define unit pixels, and planarizes the surface of the substrate 10 on which the anode electrode 130 is formed. In addition, the PDL may prevent a short-circuit from occurring between the anode electrode 130 and the cathode electrode 160.

The cathode electrode 160 is located to face the anode electrode 130. The cathode electrode 160 may be a transflective electrode or a reflective electrode. If the cathode electrode 160 is a transflective electrode, a layer made out of metal, for example, Li, Ca, LiF/Ca, LiF/Al, Al, Ag, Mg, or compound thereof, is formed to face the anode electrode 130, and an auxiliary electrode or a bus electrode line may be made out of ITO, IZO, ZnO, or $In_2O_3$ on the metal layer. In addition, if the cathode electrode 160 is a reflective electrode, Li, Ca, LiF/Ca, LiF/Al, Al, Ag, Mg, or compound thereof may be deposited on the entire surface of the substrate 10. The cathode electrode 160 may be produced by a deposition technique such as CVD or sputtering.

Locations of the anode electrode 130 and the cathode electrode 160 are exemplary, and may be reversed. The anode electrode 130 may be made out of a material having relatively high work function, and the cathode electrode 160 may be made out of a material having relatively low work function. In addition, the anode electrode 130 may be patterned to correspond to each of the unit pixels, and the cathode electrode 160 may cover entire unit pixels.

The organic layer arrangement 140 is located between the anode electrode 130 and the cathode electrode 160. When a voltage is applied between the anode electrode 130 and the cathode electrode 160, the organic layer arrangement 140 emits light.

The organic layer arrangement 140 may include a low molecular weight organic film. When the organic layer arrangement 140 is a low molecular weight organic film, the organic layer arrangement 140 may be produced by sequentially stacking a hole injection layer (HIL) 141, a hole transport layer (HTL) 143, an emission layer (EML) 145, an electron transport layer (ETL) 147, and an electron injection layer (EIL) 149 as in FIG. 2 in a single structure or a composite structure. The organic material forming the organic layer arrangement 140 may be any of various materials such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic film may be produced using vacuum deposition using masks. In addition, the organic layer arrangement 140 may be made out of a polymer organic material. In this case, the organic layer arrangement 140 may include HTL and EML. The HTL may be made out of to poly(ethylenedioxythiophene) (PEDOT), and the EML may be made out of polyphenylenevinylenes (PPVs) or polyfluorenes. The organic layer arrangement 140 may be produced by screen printing, laser induced thermal imaging (LITI), inkjet printing, vacuum deposition, or the like.

The cathode electrode 160 may be electrically connected to the cathode wiring 120 via at least one electrical connection unit 150 that is conductive. The electrical connection unit 150 may be transparent, transflective or opaque. In addition, the electrical connection unit 150 may include the same material as that of the cathode electrode 160, or be made out of some other material. A voltage applied from an external power source (not shown) may be applied to the cathode electrode 160 at more than one location via the cathode wiring 120 and one or more electrical connection units 150. Because external voltages may be applied to the cathode electrode 160 from multiple electrical connection units 150, uniform voltage distribution may be obtained throughout the entire cathode electrode 160.

Turning now to FIGS. 3A through 3D, FIGS. 3A through 3D are plan views showing upper surfaces of the organic light emitting display device 1 according to an embodiment of the present invention. FIGS. 3A through 3D show various examples of shapes and arrangements of the electrical connection unit 150. In FIGS. 3A through 3D, a unit pixel P corresponds to the organic layer arrangement 140, and in particular, a size of the EML 145.

Figure 3A:
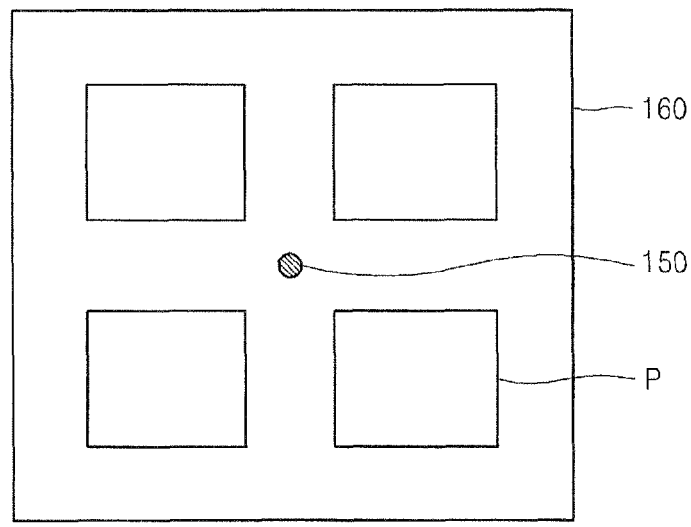
FIGS. 3A through 3D are plan views showing upper surfaces of an organic light emitting display device according to an embodiment of the present invention.

Referring to FIG. 3A, the electrical connection unit 150 may be located to electrically connect to a part of the cathode electrode 160. The electrical connection unit 150 may be located so as to be electrically connected to a portion of the cathode electrode 160 where a voltage drop is ordinarily generated. For example, the electrical connection unit 150 may be electrically connected to a center portion of the cathode electrode 160 as in FIG. 3A. In addition, the electrical connection unit 150 may be located on a region between unit pixels P, however the electrical connection unit 150 is not directly and electrically connected to the unit pixel P. The electrical connection unit 150 may be produced to have various cross-sectional shapes such as a circular or a polygonal.

Figure 3B:
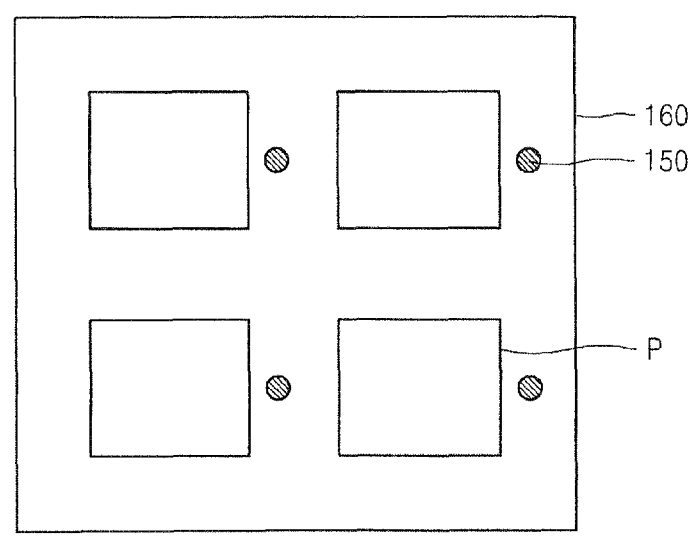
Figure 3C:
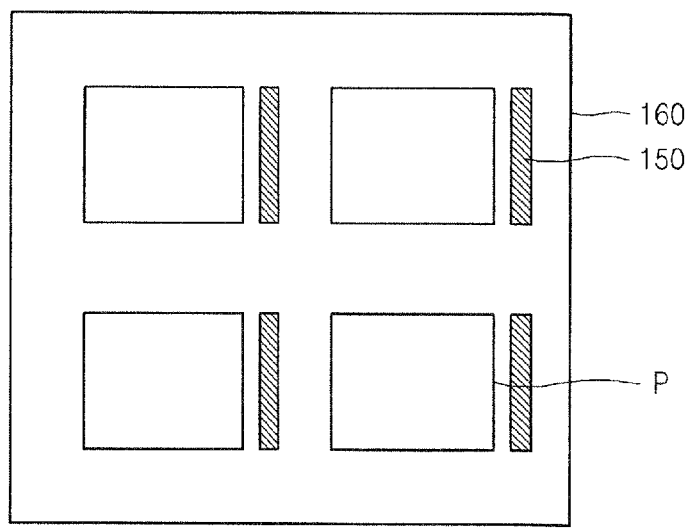
Figure 3D:
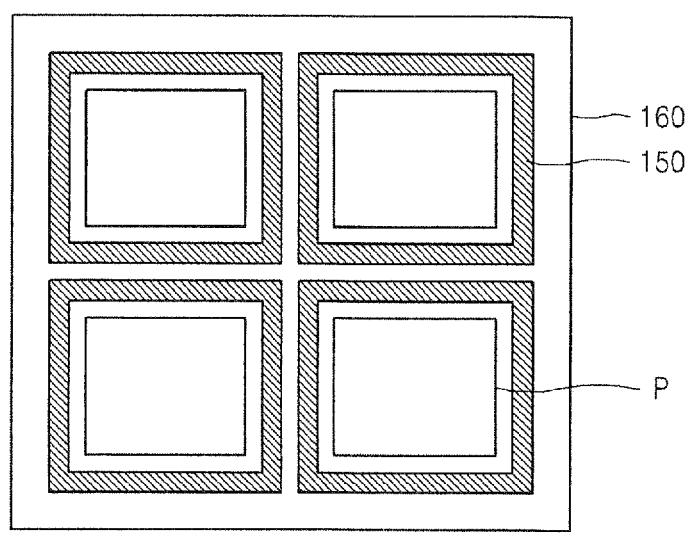

Referring to FIGS. 3B through 3D, there may be a one-to-one correspondence between the electrical connection units 150 and the unit pixels P so that one electrical connection unit 150 corresponds to each of the unit pixels P. Referring to FIG. 3B, each electrical connection unit 150 may be located to correspond to at least a part of a side of a corresponding unit pixel P. Referring to FIG. 3C, each electrical connection unit 150 may instead extend along an entire side of a corresponding unit pixel P. In FIG. 3C, a length of each electrical connection unit 150 may be the same as a length of the side of a unit pixel P or longer. Referring to FIG. 3D, each electrical connection unit 150 may be arranged to surround a corresponding unit pixel P. As described above, when each electrical connection unit 150 is formed to correspond to one of the unit pixels P, the cathode voltage of the cathode electrode 160 that is connected to the unit pixels P may be constant.

Figure 4A:
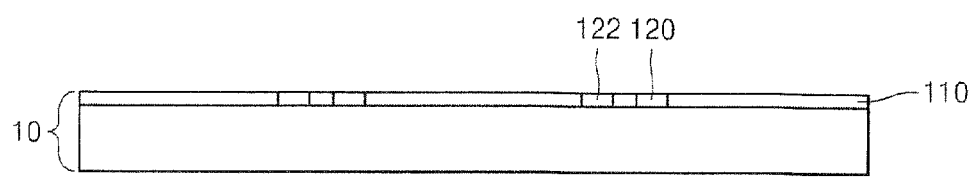
FIGS. 4A through 4E are cross-sectional views illustrating a method of manufacturing an organic light emitting display device according to an embodiment of the present invention.

Turning now to FIGS. 4A through 4E, FIGS. 4A through 4E are cross-sectional views illustrating a method of manufacturing an organic light emitting display device 1 according to an embodiment of the present invention where the opening for the electrical connection unit is formed prior to the formation of the cathode electrode. Referring to FIG. 4A, the substrate 10 including the cathode wiring 120 and the driving wiring 122 on the surface thereof is prepared. The substrate 10 may further include the protective layer 110 thereon. Although it is not shown in FIG. 4A, the substrate 10 may also include a plurality of thin film transistors (not shown) and a plurality of capacitors (not shown).

Figure 4B:
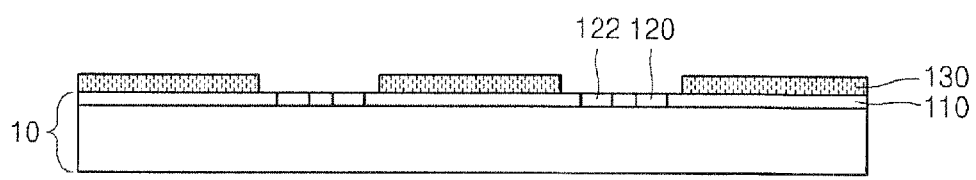

Referring to FIG. 4B, the anode electrode 130 is formed on the substrate 10. The anode electrode 130 is not formed on regions where the cathode wiring 120 are formed. The anode electrode 130 may be fabricated by forming a conductive layer on the substrate 10 by using the deposition technique, and patterning the conductive layer. The anode electrode 130 may have a size corresponding to that of the unit pixel that will be fabricated in subsequent process steps. The anode electrode 130 may be electrically connected to the thin film transistors arranged on the substrate 10.

Figure 4C:
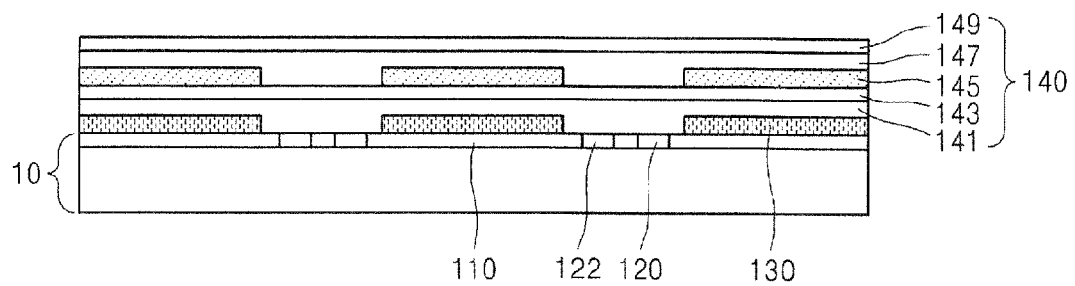

Referring to FIG. 4C, the organic layer arrangement 140 is formed on the substrate 10. The organic layer arrangement 140 may cover the anode electrode 130. The organic layer arrangement 140 may be produced by sequentially stacking the HIL 141, HTL 143, EML 145, ETL 147, and EIL 149 on the substrate 10. The HIL 141, HTL 143, ETL 147, and EIL 149 may be produced by using an open mask or a fine metal mask (FMM). On the other hand, the EML 145 is produced by using the FMM. A size of the EML 145 may correspond to that of the anode electrode 130, and may determine a size of the unit pixel. In the example of FIG. 4C, the HIL 141, HTL 143, ETL 147, and EIL 149 are produced by using the open mask, and the EML 145 is produced by using the FMM. In addition, a part of the organic layer arrangement 140 may cover the cathode wiring 120. Here, the EML 145 is not formed on the cathode wiring 120.

Figure 4D:
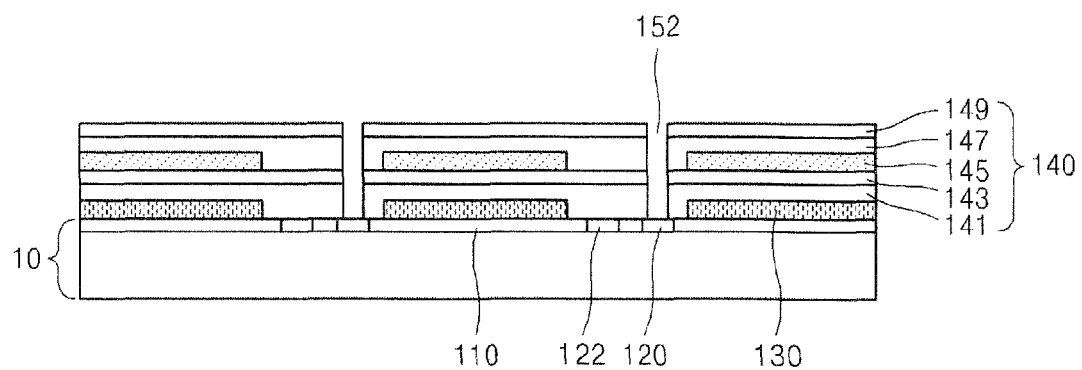

Referring to FIG. 4D, a first opening 152 penetrating through the organic layer arrangement 140 and exposing the cathode wiring 120 is formed. The first opening 152 may be produced by pressing, laser radiation, etching, or combination thereof, and will be described in more detail with reference to FIGS. 6A through 6C.

Figure 4E:
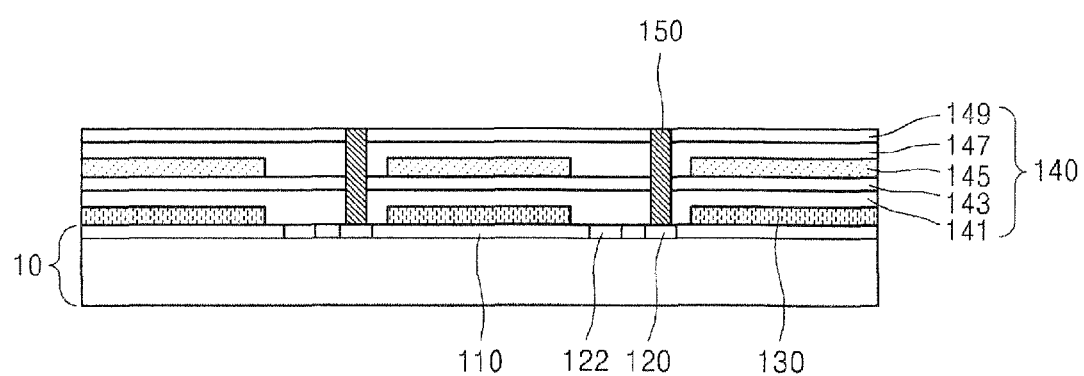

Referring to FIG. 4E, the first opening 152 is filled with a conductive material to form the electrical connection unit 150. Accordingly, the electrical connection unit 150 is electrically connected to the cathode wiring 120. In addition, the cathode electrode 160 that covers the organic layer arrangement 140 and is electrically connected to the electrical connection unit 150 is formed. Therefore, the structure shown in FIG. 2 is fabricated. The electrical connection unit 150 and the cathode electrode 160 may be fabricated under the same fabrication processes. In addition, the electrical connection unit 150 may be made out of the same material as the cathode electrode 160, or may be made out of other materials.

Figure 5A:
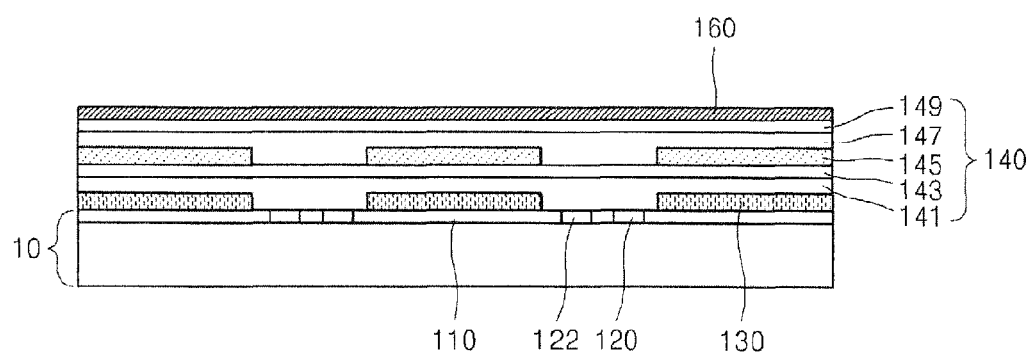
FIGS. 5A through 5C are cross-sectional views illustrating a method of manufacturing an organic light emitting display device according to another embodiment of the present invention.
Figure 5B:
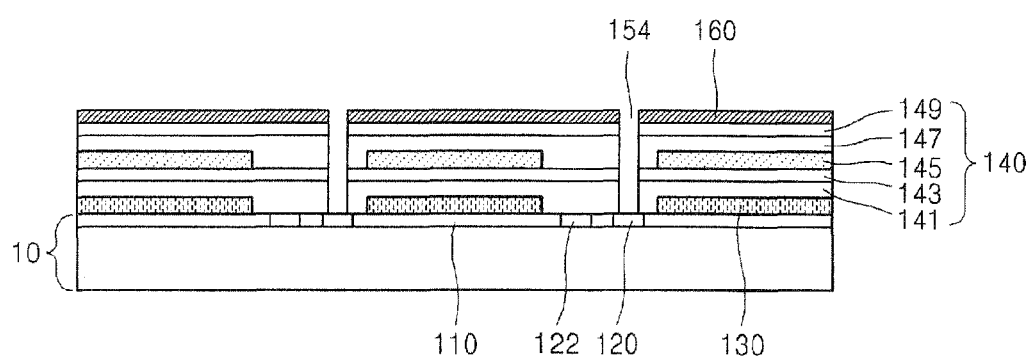
Figure 5C:
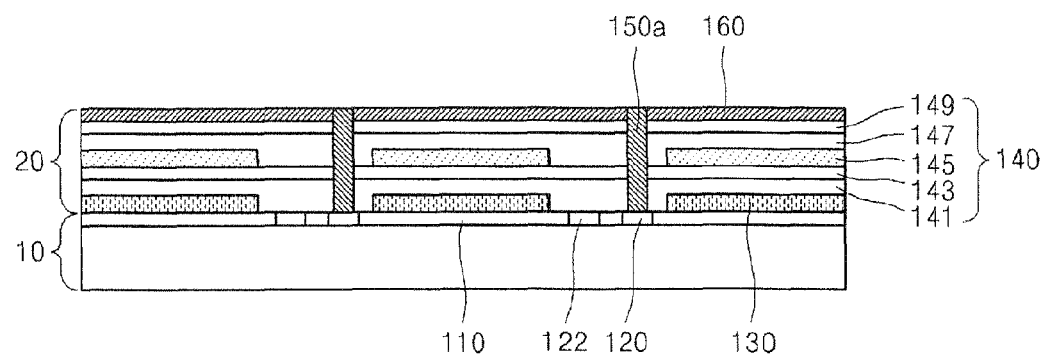

Turning now to FIGS. 5A through 5C, FIGS. 5A through 5C are cross-sectional views illustrating a method of manufacturing the organic light emitting display device 1 according to another embodiment of the present invention where the opening for the electrical connection unit is formed after the formation of the cathode electrode. As described above in conjunction with FIGS. 4A through 4C, the cathode wiring 120, the driving wiring 122, the protective layer 110, the anode electrode 130 and the organic layer arrangement 140 are first arranged on the substrate 10 to achieve the design of FIG. 4C. Then, the processes illustrated in FIGS. 5A through 5C are performed on the structure shown in FIG. 4C.

Referring to FIG. 5A, the cathode electrode 160 is formed on the entire surface of the structure shown in FIG. 4C, that is, on the organic layer arrangement 140. In other words, unlike the method of FIGS. 4D and 4E, the cathode electrode 160 is formed on the organic layer arrangement 140 prior to the formation of the opening for the electrical connection member. Referring to FIG. 5B, a second opening 154 penetrating through the cathode electrode 160 and the organic layer arrangement 140 and exposing the cathode wiring 120 is now formed. The second opening 154 may be produced by pressing, laser radiation, etching, or combination thereof, and will be described in more detail with reference to FIGS. 6A through 6C. Second opening 154 of FIG. 5B differs from first opening 152 in FIG. 4D in that second opening 154 perforates cathode electrode 160 while first opening 152 of FIG. 4D does not perforate a cathode electrode.

Referring to FIG. 5C, the second opening 154 is filled with a conductive material to form an electrical connection unit 150a. Accordingly, the electrical connection unit 150a is electrically connected to the cathode wiring 120 and to the cathode electrode 160. Unlike the embodiment of FIG. 4E, the electrical connection unit 150a of FIG. 5C is formed subsequent to the formation of the cathode electrode 160 while electrical connection unit 150 of FIG. 4E is formed prior to or simultaneous with the formation of the cathode electrode 160.

Figure 6A:
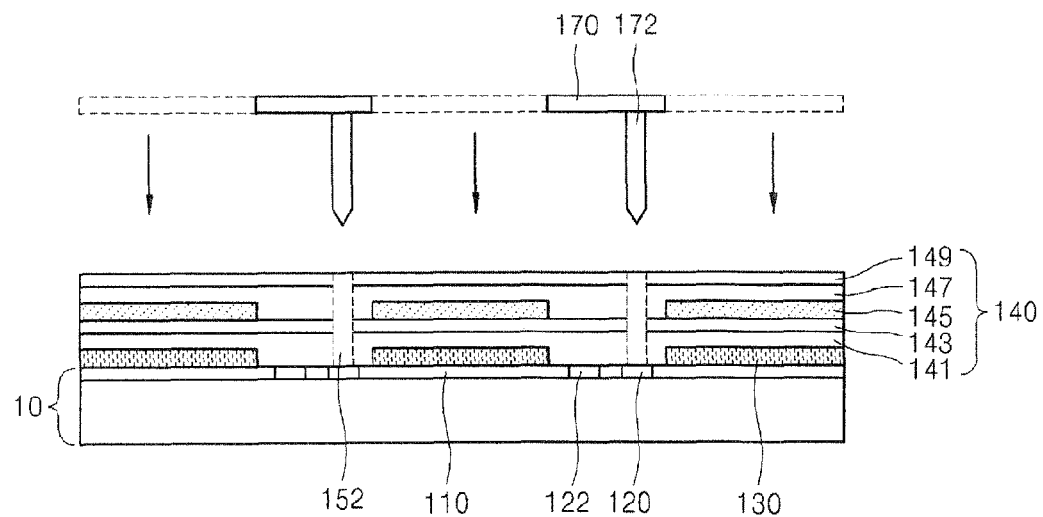
FIGS. 6A through 6C are cross-sectional views illustrating processes of forming an electrical connection unit shown in FIG. 2.
Figure 6B:
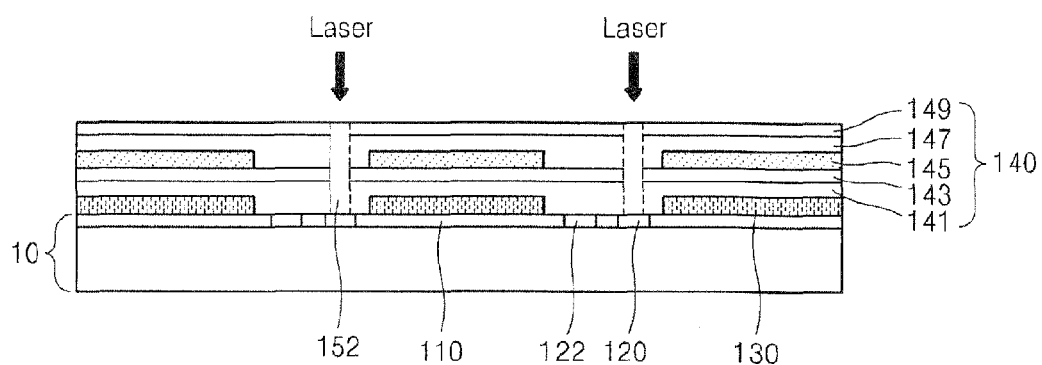
Figure 6C:
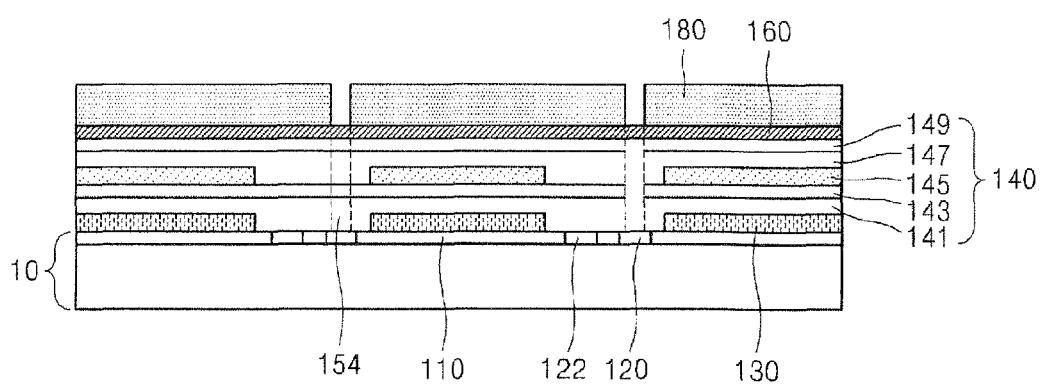

Turning now to FIGS. 6A through 6C, FIGS. 6A through 6C are cross-sectional views illustrating three different techniques for forming the openings 152 and 154 for electrical connection units 150/150a as per FIGS. 4D and 5B. Referring to FIG. 6A, a mask 170 that includes a protrusion 172 is pressed onto the substrate 10 on which the organic layer arrangement 140 is formed, and then the first opening 152 that penetrates through the organic layer arrangement 140 and exposes the cathode wiring 120 is formed. The mask 170 may be a general glass material or a plastic material or may be the FMM that is used to form the organic layer arrangement 140. The protrusion 172 may have a size corresponding to that of the first opening 152. A width of the protrusion 172 may correspond to a width of the first opening 152, and a length of the protrusion 172 is equal to or greater than a length of the first opening 152. That is, the protrusion 172 should be long enough to expose the cathode wiring 120, and thus have a length greater than a total thickness of the organic layer arrangement 140. In addition, the protrusion 172 may be formed to have various cross-sectional shapes, for example, polyhedron such as a rectangular parallelpiped, a cylinder, a cone, a truncated cone, or a combination thereof. The protrusion 172 may be attached to the mask 170 or may be produced by etching the mask 170.

Referring to FIG. 6B, laser is irradiated onto the region of the organic layer arrangement 140 corresponding to the first opening 152 to remove a part of the organic layer arrangement 140. Accordingly, the first opening 152 that penetrates through the organic layer arrangement 140 and exposes the cathode wiring 120 is formed.

Referring to FIG. 6C, a mask pattern 180 such as a photoresist pattern is formed on the cathode electrode 160. The cathode electrode 160 and the organic layer arrangement 140 are then etched according to the mask pattern 180 thereby forming the second opening 154 that penetrates through the cathode electrode 160 and the organic layer arrangement 140 and exposes the cathode wiring 120.

The techniques for forming the first and second openings 152 and 154 are examples, and accordingly, the second opening 154 may instead be produced by the techniques illustrated in FIGS. 6A and 6B and the first opening 152 may instead be produced by the techniques illustrated in FIG. 6C. As described above, the first and second openings 152 and 154 are filled with the conductive materials to form the electrical connection units 150 and 150a.

According to the organic light emitting display device of the present invention, the cathode wiring 120 is formed on the substrate and is electrically connected to the cathode electrode 160, and thus, the voltages may be applied simultaneously to the outer and inner sides of the cathode electrode 160 so that a voltage drop across the cathode electrode 160 may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device, comprising:
    a substrate;
    cathode wiring arranged on a surface of the substrate;
    an anode electrode arranged on the substrate and electrically insulated from the cathode wiring;
    an organic layer arrangement arranged on the anode electrode to form a plurality of unit pixels;
    a cathode electrode covering the organic layer arrangement; and
    at least one electrical connection unit to electrically connect the cathode wiring to the cathode electrode,
    wherein the cathode electrode is comprised of a material selected from a group consisting of Li, Ca, LiF/Ca, LiF/Al, Al, Ag, Mg, indium tin oxide (ITO), indium zinc oxide (IZO), ZnO and $In_2O_3$,
    wherein the electrical connection unit comprises a same material as that of the cathode electrode.

2. The organic light emitting display device of claim 1, wherein the electrical connection unit penetrates through the organic layer arrangement.

3. The organic light emitting display device of claim 1, wherein the organic layer arrangement comprises an organic emission layer, the electrical connection unit being electrically insulated from the organic emission layer.

4. The organic light emitting display device of claim 1, wherein the electrical connection unit is electrically connected to a portion of the cathode electrode where a voltage drop occurs.

5. The organic light emitting display device of claim 1, wherein the electrical connection unit is electrically connected to a center portion of the cathode electrode.

6. The organic light emitting display device of claim 1, wherein the electrical connection unit is arranged between adjacent ones of the plurality of unit pixels.

7. The organic light emitting display device of claim 1, wherein the organic light emitting display device comprises a plurality of electrical connection units, wherein there is a one-to-one correspondence between the electrical connection units and the unit pixels.

8. The organic light emitting display device of claim 7, wherein each electrical connection unit extends along a side surface of a corresponding one of the plurality of unit pixels.

9. The organic light emitting display device of claim 7, wherein each electrical connection unit surrounds an outer surface of a corresponding one of the plurality of unit pixels.

10. The organic light emitting display device of claim 1, wherein the cathode electrode is a transflective electrode.

11. The organic light emitting display device of claim 1, wherein the organic layer arrangement is comprised of a hole injection layer, a hole transport layer, the organic emission layer, an electron transport layer, and an electron injection layer sequentially stacked.

12. The organic light emitting display device of claim 1, further comprises driving wiring, wherein the cathode wiring and the driving wiring are arranged on a same plane.

13. An organic light emitting display device, comprising:
    a substrate;
    cathode wiring arranged on a surface of the substrate;
    an anode electrode arranged on the substrate and electrically insulated from the cathode wiring;
    an organic layer arrangement arranged on the anode electrode to form a plurality of unit pixels;
    a cathode electrode covering the organic layer arrangement; and
    at least one electrical connection unit to electrically connect the cathode wiring to the cathode electrode,
    wherein the cathode electrode is comprised of a material selected from a group consisting of Li, Ca, LiF/Ca, LiF/Al, Al, Ag, Mg and a compound thereof,
    wherein the electrical connection unit comprises a same material as that of the cathode electrode.

14. The organic light emitting display device of claim 1, wherein the at least one electrical connection unit to provide a uniform voltage distribution throughout the cathode electrode by including a plurality of electrical connection units that simultaneously apply a voltage from the cathode wiring to the cathode electrode.

15. The organic light emitting display device of claim 1, wherein the at least one electrical connection unit comprises a plurality of electrically conductive electrical connection units to electrically connect the cathode wiring to the cathode electrode in more than one location to prevent a voltage drop across the cathode electrode.

16. The organic light emitting display device of claim 1, wherein a pixel definition layer covers the edges of the anode.

17. The organic light emitting display device of claim 3, wherein the organic emission layer is separated from the electrical connection unit.

* * * * *